United States Patent
El Yacoubi et al.

(10) Patent No.: US 10,468,971 B2
(45) Date of Patent: Nov. 5, 2019

(54) POWER CONVERTER CONFIGURED FOR LIMITING SWITCHING OVERVOLTAGE

(71) Applicant: TM4 Inc., Boucherville (CA)

(72) Inventors: Maalainine El Yacoubi, Montréal (CA); Marion Nourry, Sorel-Tracy (CA); Benoit Blanchard St-Jacques, McMasterville (CA); Pascal Fleury, Sainte-Madeleine (CA); Jean-Marc Cyr, Candiac (CA); Mohammed Amar, Montréal (CA)

(73) Assignee: TM4, Inc., Boucherville, Quebec (CA)

( * ) Notice: Subject to any disclaimer, the term of this patent is extended or adjusted under 35 U.S.C. 154(b) by 0 days.

(21) Appl. No.: 15/757,515

(22) PCT Filed: Sep. 13, 2016

(86) PCT No.: PCT/CA2016/051079
§ 371 (c)(1),
(2) Date: Mar. 5, 2018

(87) PCT Pub. No.: WO2017/045071
PCT Pub. Date: Mar. 23, 2017

(65) Prior Publication Data
US 2018/0248475 A1 Aug. 30, 2018

Related U.S. Application Data

(60) Provisional application No. 62/218,142, filed on Sep. 14, 2015.

(51) Int. Cl.
*H02M 1/32* (2007.01)
*H02M 1/08* (2006.01)
(Continued)

(52) U.S. Cl.
CPC ............... *H02M 1/32* (2013.01); *H02M 1/08* (2013.01); *H03K 17/0828* (2013.01);
(Continued)

(58) Field of Classification Search
CPC .......... H02M 1/32; H02M 1/08; H02M 1/083; H03K 17/08128
See application file for complete search history.

(56) References Cited

U.S. PATENT DOCUMENTS 4,777,386 A * 10/1988 Majumdar ....... H03K 17/04126
327/109
5,723,916 A * 3/1998 Disney .................... F02P 3/051
123/630
(Continued)

FOREIGN PATENT DOCUMENTS

WO 2013/082705 6/2013
WO 2014/043795 3/2014
(Continued)

OTHER PUBLICATIONS

Azeroual et al., "Limiting the Overshoot on IGBT During Turn-Off Using Stray Inductance," ATZ elektronik, 2012, vol. 7, pp. 16-20.*
(Continued)

*Primary Examiner* — Gary L Laxton
*Assistant Examiner* — Sisay G Tiku
(74) *Attorney, Agent, or Firm* — Marshall & Melhorn, LLC

(57) ABSTRACT

The present disclosure relates to a power converter configured for limiting switching overvoltage. The power converter comprises a bottom commutation cell that includes a bottom power electronic switch and a bottom compensation circuit connected to a bottom parasitic inductance. The bottom compensation circuit applies a sample of the voltage induced across the bottom parasitic inductance at turn-off of
(Continued)

the bottom power electronic switch to the reference node of the bottom gate driver. The power converter also comprises a top commutation cell that includes top power electronic switch and a top compensation circuit connected to the bottom parasitic inductance. The top compensation circuit applies a sample of the voltage induced across the bottom parasitic emitter upon turn-off of the top power electronic switch to the reference node of the top gate driver. The top and bottom commutation cells are part of a loop, being connected at a junction of the collector of the bottom power electronic switch and the emitter of the top power electronic switch.

13 Claims, 7 Drawing Sheets

(51) Int. Cl.
*H03K 17/0812* (2006.01)
*H03K 17/082* (2006.01)
*H02M 3/158* (2006.01)
*H02M 7/5387* (2007.01)
*H02M 1/34* (2007.01)
*H02M 1/00* (2006.01)

(52) U.S. Cl.
CPC ....... *H03K 17/08128* (2013.01); *H02M 3/158* (2013.01); *H02M 7/5387* (2013.01); *H02M 2001/0054* (2013.01); *H02M 2001/344* (2013.01); *H02M 2001/348* (2013.01)

(56) References Cited

U.S. PATENT DOCUMENTS

| | | | | |
|---|---|---|---|---|
| 2003/0021131 A1* | 1/2003 | Nadot | ..................... | H02M 1/34 363/55 |
| 2003/0095365 A1* | 5/2003 | Nakatake | ............... | H02H 7/122 361/91.1 |
| 2009/0296291 A1* | 12/2009 | Volke | ................. | H03K 17/0822 361/56 |
| 2011/0273206 A1* | 11/2011 | Lee | ......................... | H02M 1/08 327/109 |
| 2014/0321178 A1 | 10/2014 | Cyr et al. | | |
| 2014/0334214 A1* | 11/2014 | Katoh | ............... | H02M 7/53803 363/132 |
| 2015/0028923 A1* | 1/2015 | Peng | ..................... | H03K 17/166 327/109 |
| 2016/0043711 A1* | 2/2016 | Cyr | ......................... | H02M 1/32 318/400.22 |
| 2016/0285357 A1* | 9/2016 | Cyr | .................. | H03K 17/08128 |
| 2016/0294275 A1* | 10/2016 | Pronovost | ............ | H03K 17/166 |
| 2016/0301308 A1* | 10/2016 | Amar | ................. | H03K 17/0828 |
| 2018/0183321 A1* | 6/2018 | Cyr | ......................... | H01L 23/48 |
| 2018/0191339 A1* | 7/2018 | Cyr | ......................... | H02M 1/34 |

FOREIGN PATENT DOCUMENTS

| | | |
|---|---|---|
| WO | 2015/061901 | 5/2015 |
| WO | 2015/070347 | 5/2015 |
| WO | 2015/139132 | 9/2015 |
| WO | 2016/205929 | 12/2016 |

OTHER PUBLICATIONS

Cyr, Presentation made on Apr. 18, 2013: "Reducing switching losses with Reflex(TM) Gate Driver Technology," pp. 1-30.*
Lobsiger et al., "Closed-Loop IGBT Gate Drive Featuring Highly Dynamic di/dt and dv/dt Control", IEEE Energy Conversion Congress and Exposition (ECCE), Sep. 2012, pp. 4754-4761.
Dulau et al., "A New Gate Driver Integrated Circuit for IGBT Devices With Advanced Protections", IEEE Transactions on Power Electronics, vol. 21, No. 1, Jan. 2006, pp. 38-44.
PCT International Search Report of International Searching Authority for International Patent Application No. PCT/CA2016/051079, dated Nov. 29, 2016, 3 pages.
PCT Written Opinion of International Searching Authority for International Patent Application No. PCT/CA2016/051079, dated Nov. 29, 2016, 5 pages.

* cited by examiner

Prior Art

Prior Art

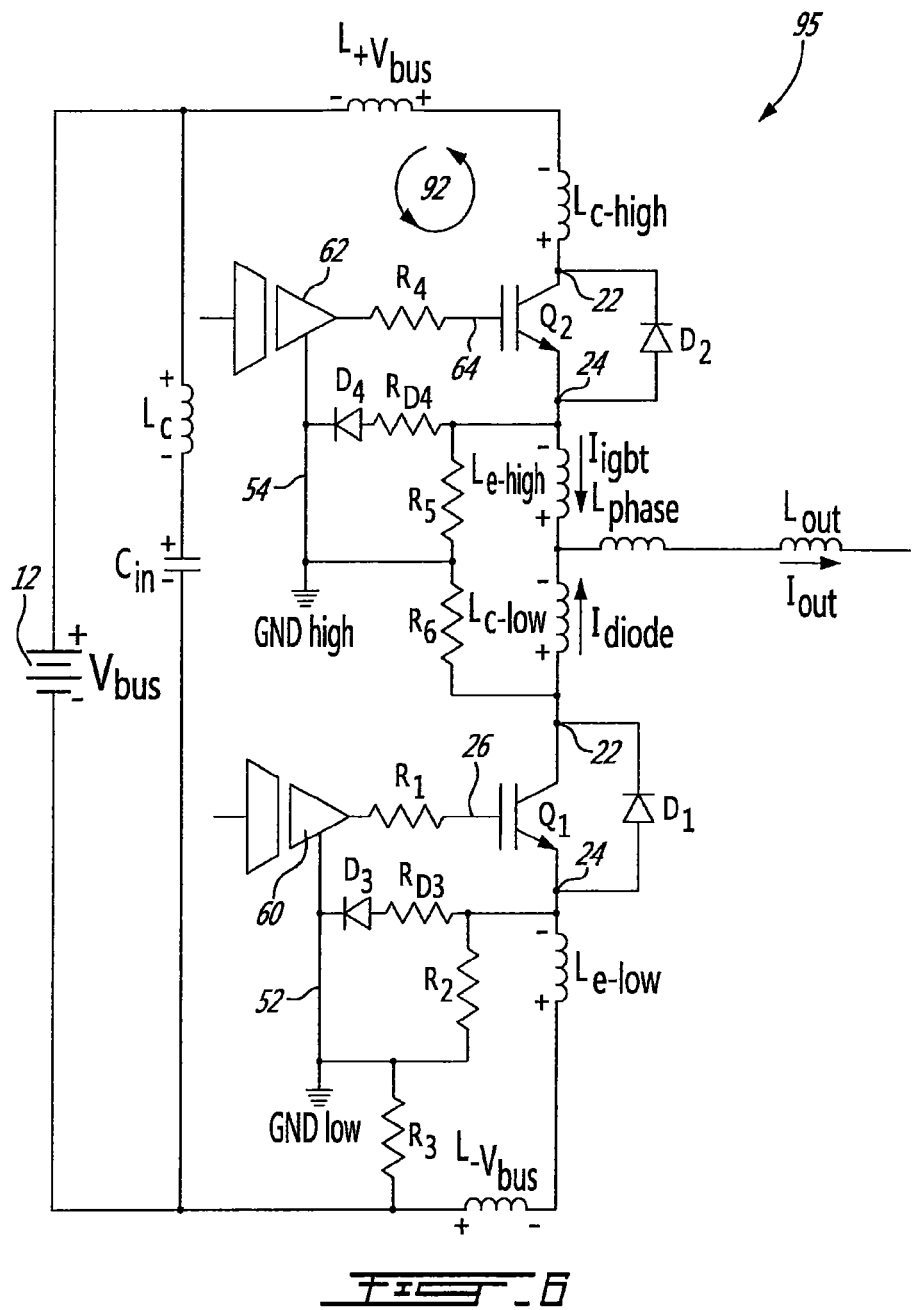
Prior Art

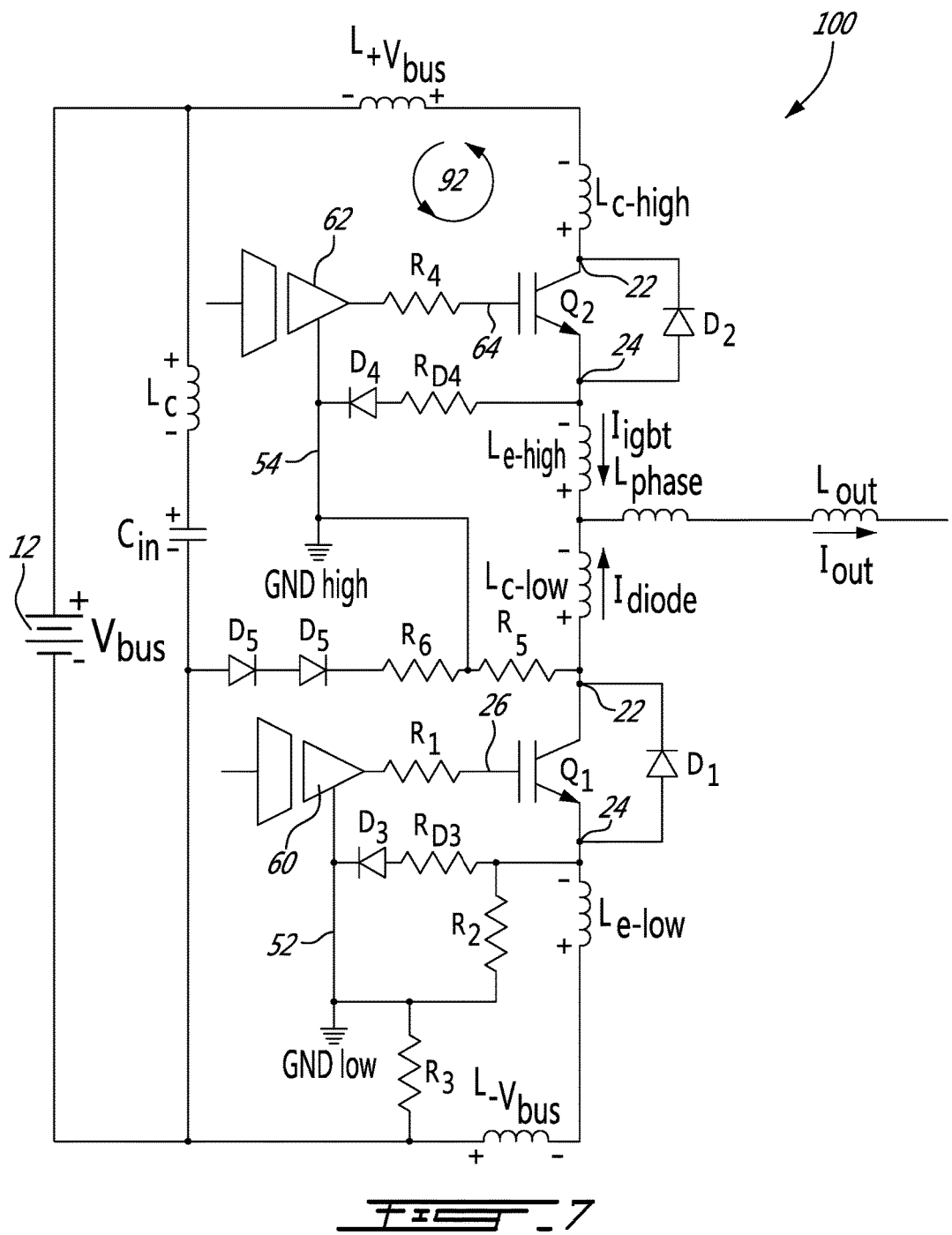

POWER CONVERTER CONFIGURED FOR LIMITING SWITCHING OVERVOLTAGE

CROSS REFERENCE TO RELATED APPLICATIONS

This application is a national phase under 35 U.S.C. § 371 of International Application No. PCT/CA2016/051079 filed on Sep. 13, 2016, which claims priority to and benefit of U.S. Provisional Application No. 62/218,142 filed on Sep. 14, 2015, and the entirety of each of these applications is incorporated by reference herein.

TECHNICAL FIELD

The present disclosure relates to the field of power electronics. More specifically, the present disclosure relates to a power converter configured for limiting switching overvoltage

BACKGROUND

Commutation cells are commonly used in electronic systems that require conversion of a voltage source, including both DC-DC converters and DC-AC converters, which are often called inverters. With the limited space allowed for power converter circuits, such as those used for example in electric and/or electric hybrid automotive applications, and given the high cost of the semi-conductors, the demand for integration of these commutation cells increases.

A known way of reducing the space occupied by semi-conductors in power converter circuits is to increase their efficiency to allow the size of the cooling surface to be reduced.

Losses in power electronic switches present in conventional power converter circuits are mainly caused by two sources; conduction losses and switching losses. One way to reduce switching losses is generally by accelerating turn-on and turn-off of the power electronic switches. However, fast turn-off of the power electronic switches induces overvoltage in stray inductances of their high-frequency loop. It is thus often required to slow down turning off of the power electronic switches to protect them against overvoltage. This may seriously impact the overall efficiency of conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14 connected to a positive tab of the voltage source 12, the load 14 being for example a resistive load, an electric motor, and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance $L_{out}$ 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10, of the load 14, and of the voltage source 12, in which energy flows from the voltage source 12 to the load 14, i.e. from left to right on the drawing. The commutation cell 10 can also be used in a reverse configuration in which energy flows in the opposite direction, in which case the load 14 is connected between the output inductance $L_{out}$ 32 and a negative tab of the voltage source 12.

When turned on (i.e. closing), the power electronic switch 18 allows current to pass therethrough, from its collector 22 to its emitter 24; at that time, the power electronic switch 18 can be approximated as a closed circuit. When turned off (i.e. opening), the power electronic switch 18 does not allow current to pass therethrough and becomes an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high", the power electronic switch 18 allows passing of current from the collector 22 to the emitter 24. When the voltage applied between the gate 26 and the emitter 24 is "low", the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ge}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types, for example bipolar transistors, the term "gate" may be replaced with "base", the base being controlled by a current as opposed to the gate that is controlled by a voltage. These distinctions, well known to those skilled in the art, do not change the overall operation principles of the commutation cell 10.

FIG. 2 is another circuit diagram of the conventional commutation cell of FIG. 1, showing parasitic (stray) inductances. In contrast with the idealized model of FIG. 1, connections between components of an actual commutation cell define parasitic inductances. Though the parasitic inductances are distributed at various places within the commutation cell 10, a suitable model presented in FIG. 2 shows two (2) distinct inductances representing the overall parasitic inductance, including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop 36 because its current remains fairly constant through the commutation period.

FIG. 3 is a circuit diagram of a conventional commutation cell further showing a gate driver 40. Some elements of the commutation cell 10 are not shown on FIG. 3, in order to simplify the illustration. FIG. 3 shows a gate driver 40 having a positive supply voltage 42, a negative supply voltage 44 and an output 46 being connected to the gate 26 of the power electronic switch 18 via a gate resistor $R_g$. The positive supply voltage 42 of the gate driver 40 has a value denoted $+V_{cc}$, for example +15 volts above a ground reference (shown on a later Figure) while the negative supply voltage 44 has value denoted $-V_{dd}$, for example −5 volts below the ground reference. A ground reference of the gate driver 40 is connected to the emitter 24 of the power electronic switch 18; this connection is not shown on FIG. 3. An input 50 of the gate driver 40 is connected to a controller (not shown) of the commutation cell 10, as is well known in the art. A voltage at the output 46 of the gate driver 40 goes up to $+V_{cc}$ and goes down to $-V_{dd}$ in order to control the voltage at the gate 26. The input resistance of the gate 26 to emitter may be very high, especially in the case where the electronic switch 18 is an IGBT. However, a parasitic capacitance $C_{ge}$ (shown on a later Figure), present between the gate 26 and the emitter 24 and a parasitic Miller capacitance $C_{gc}$ (not shown), present between the gate 26 and the collector 22, for a total gate equivalent capacitor $C_{ies}$, causes some current to flow from the output 46 when the gate driver 40 alternates between $+V_{cc}$ and $-V_{dd}$. The value $R_g$ of the gate resistor is selected as a function of the parasitic capacitance $C_{ies}$ and of a desired switching rate of the power electronic switch 18 so that the voltage at the gate 26 changes at a rate appropriate for the desired switching rate.

On FIG. 3, a current $I_{igbt}$ flowing through the power electronic switch 18 and through the emitter parasitic inductance 30 is essentially equal to $I_{out}$ when the power electronic switch 18 is closed, and quickly reduces to substantially zero when the power electronic switch 18 turns off.

When the power electronic switch 18 turns on or off, the current $I_{igbt}$ flowing therethrough increases or diminishes at a fast rate. These variations of $I_{igbt}$, denoted di/dt, induce voltage across inductances 30 and 34, according to the well-known equation (1):

$$V_L = L \cdot \frac{di}{dt} \quad (1)$$

wherein $V_L$ is a voltage induced across an inductance and L is an inductance value.

A voltage $V_L$, is induced across the parasitic inductance 34 and a voltage $V_{Le}$ is induced across the emitter parasitic inductance 30. On FIGS. 2 and 3, the polarities shown across the inductances of the high frequency loop 36, including the emitter inductance 30, reflect voltages obtained upon turn-off of the power electronic switch 18, when the $I_{igbt}$ current diminishes very rapidly, di/dt thus taking a negative value. Upon turn-on of the power electronic switch 18, voltages across the inductances of the high frequency loop 36, including the emitter inductance 30, are in the opposite direction.

These voltages $V_{Ls}$ and $V_{Le}$ are in series with $V_{bus}$ from the voltage source 12. When the power electronic switch 18 turns off, the collector 22 to emitter 24 voltage increases until the freewheel diode 16 turns on. At that time, addition of $V_{bus}$, $V_{Ls}$ and $V_{Le}$ results in an important overvoltage applied between the collector 22 and the emitter 24 of the power electronic switch 18. Though power electronic switches are rated for operation at some level of overvoltage, extreme overvoltage can reduce the lifetime of any power electronic switch to thereby lead to its premature failure.

FIG. 4 is a circuit diagram of an IGBT leg having resistive dividers connected across parasitic (stray) emitter inductances, forming compensation circuits. The circuit of FIG. 4 was introduced in International Patent Publication No. WO 2014/161080 A1 to Jean-Marc Cyr et al., published on Oct. 9, 2014, the disclosure of which is incorporated by reference herein.

Generally, FIG. 4 shows a power converter having a pair of commutation cells connected in parallel, each commutation cell including a power electronic switch and a gate driver. The power converter may for example be an IGBT leg 90 including compensation circuits connected to gate drivers in a configuration that reduces overvoltage on the IGBTs. The IGBT leg 90 may for example form one third of a three-phase alternative current (AC) power source driving an electric motor (not shown) from battery 12. The IGBT leg 90 feeds a current source $I_{out}$ via an inductance $L_{out}$ through a phase tab (not shown) connected between top and bottom power electronic switches, the phase tab having a parasitic inductance $L_{phase}$. FIG. 4 introduces compensation circuits that optimize overvoltage on the IGBT using a resistive divider across the emitter parasitic inductance.

The IGBT leg 90 comprises a top commutation cell including a top IGBT $Q_2$ and a bottom freewheel diode $D_1$. The top IGBT $Q_2$ is driven by a gate driver 62 connected to a gate 64 of the top IGBT $Q_2$ via a resistor R4. A top compensation circuit includes a turn-on diode $D_4$ and resistors $R_5$ and $R_6$. In the IGBT leg 90, a bottom commutation cell includes a bottom IGBT $Q_1$ and a top freewheel diode $D_2$. The bottom IGBT $Q_1$ is driven by a gate driver 60 connected to a gate 26 of the bottom IGBT $Q_1$ via a resistor $R_1$. A bottom compensation circuit includes a turn-on diode $D_3$ and resistors $R_2$ and $R_3$. The top commutation cell operates when $I_{out}$ is positive (in the direction shown in FIG. 4) and the bottom commutation cell operates when $I_{out}$ is in the opposite direction.

Components of the IGBT leg 90 are placed on a power module (not shown) having a positive voltage tab connected to $+V_{bus}$, a negative voltage tab connected to $-V_{bus}$ (also not shown) and a phase voltage tab connected to $L_{out}$. Connections between these components create a number of parasitic inductances, including a parasitic positive voltage tab $L_{+Vbus}$, a parasitic top collector inductance $L_{c-high}$, a parasitic top emitter inductance $L_{e-high}$, a parasitic bottom collector inductance $L_{c-low}$, a parasitic bottom emitter inductance $L_{e-low}$, a parasitic negative voltage tab inductance $L_{-bus}$ and input capacitor inductance $L_c$. The two commutation cells combine with an input capacitance $C_{in}$ of a voltage source 12 to form a high frequency loop 92 of the IGBT leg 90.

Discussing the bottom commutation cell of the IGBT leg 90 of FIG. 4, the gate 26 of the bottom IGBT $Q_1$ connected to its gate driver 60 via the resistor $R_1$. A ground reference 52 of the gate driver 60 (GND low) is connected to a bottom compensation circuit having a resistive divider circuit including the two resistors $R_2$ and $R_3$ and the turn-on diode $D_3$, which allows the turn-on not to be impacted by the resistive divider by keeping the voltage at the emitter of the bottom IGBT $Q_1$ not lower than the ground reference 52. The turn-on diode $D_3$ is conducting while turning on the bottom IGBT $Q_1$ because the direction of its current in positive. In contrast, the turn-on diode $D_3$ is not conducting while turning off the bottom IGBT $Q_1$ because of the voltage induced across the emitter inductance during the di/dt applies a negative voltage across the turn-on diode $D_3$.

In the circuit of FIG. 4, values of the resistors $R_2$ and $R_3$ are selected according to an acceptable overvoltage level allowed across the bottom IGBT $Q_1$. A ratio of $R_2$ over $R_3$ is increased to reduce the overvoltage. The value of the equivalent gate resistor is set with these two resistors $R_2$ and $R_3$ in parallel, in series with a gate driver resistor $R_1$. A value of the gate driver resistor $R_1$ is adjusted in a conventional manner according to a proper commutation behavior.

In other words, the normal practice consisting in using a resistor $R_1$ in the ground connection of the gate driver to limit the current in the diodes that protect the gate driver 60 of the bottom IGBT $Q_1$ from a negative voltage when the top IGBT $Q_2$ turns off has been modified by splitting the resistor in two resistors, including $R_1$ in series with $R_2$ and $R_3$ connected in parallel, and by adapting their ratio to limit the effect of the emitter inductance on the di/dt. An equivalent resistor value may remain the same, but the voltage divider gives the desired weight of the emitter inductance to limit the overvoltage at the desired level.

By correctly setting values of the resistors of the compensation circuits, it is possible to reduce the effect of the emitter inductance to get the maximum overvoltage allowed to therefore improve the efficiency.

The overvoltage can be optimized as much as possible to reach the maximum IGBT rating while maintaining the speed of the di/dt for efficiency reasons. This is done by reducing a value of $R_2$, the resistor connected to the IGBT emitter, compared to $R_3$, the resistor connected to the power tab. The voltage across the emitter inductance is thus split in two parts and only the part of the voltage across $R_2$ is applied in the gate drive circuit to limit the gate voltage drop.

The values of the resistors $R_2$ and $R_3$ are selected according to the level of overvoltage allowed across Q1. FIG. 5 is a diagram showing turn-off waveforms of the bottom IGBT of FIG. 4. In more details, FIG. 5 show the result of a resistive divider optimized for an operation at a bus voltage $V_{bus}$ of 500 Vdc. The ratio of $R_2$ over $R_3$ can be increased to reduce the overvoltage. The equivalent value of the two resistors $R_2$ and $R_3$, in parallel, is set in series with $R_1$, which is adjusted according to the proper commutation behavior of the bottom IGBT $Q_1$. By setting the resistor values correctly, it is possible to reduce the effect of the emitter inductance to get the maximum overvoltage allowed on the bottom IGBT $Q_1$ to therefore improve the efficiency.

The collector to emitter overvoltage may be optimized as much as possible to reach the maximum voltage rating of the bottom IGBT $Q_1$. This is done by reducing a value of the resistor $R_2$ connected to the logical emitter of the bottom IGBT $Q_1$ compared to a value of the resistor $R_3$ connected to the power tab. The voltage across the emitter inductance $L_{e-low}$, alone or with the negative voltage tab inductance $L_{-Vbus}$, is split in two parts and only the voltage across the resistor $R_2$ is applied at the reference 52 of the gate driver 60 to limit the voltage drop at the gate 26 of the bottom IGBT $Q_1$.

FIG. 5 shows the current $L_{igbt}$, the gate to emitter voltage $V_{ge}$ and the collector to emitter voltage $V_{ce}$ during turn-off of the bottom IGBT $Q_1$ of FIG. 4. It is notable that $V_{ce}$ peaks at a plateau 80 whose value is tailored according to the maximum voltage rating of the bottom IGBT $Q_1$. This plateau 80 occurs while the rate of drop of $V_{ge}$ is contained at area 82 by the insertion of the voltage sample from the parasitic inductances $L_{e-low}$ and $L_{-Vbus}$.

FIG. 6 is a circuit diagram in which the compensation circuits of FIG. 4 are modified to impact the turn-on of the IGBTs. A variant of the circuit of FIG. 6 was introduced in U.S. Provisional Patent Application Ser. No. 62/183,437 to Jean-Marc Cyr et al., filed on Jun. 23, 2015, the disclosure of which is incorporated by reference herein.

Generally, FIG. 6 shows a modified IGBT leg 95 in which the ground reference 52 (GND low) is now electrically connected to the emitter 24 of the bottom IGBT $Q_1$ via the turn-on diode $D_3$ placed in series with a resistor $R_{D3}$. The turn-on diode $D_3$ is polarized to become short when an emitter voltage of the bottom IGBT $Q_1$ is higher than a voltage of the ground reference 52. The ground reference 52 is also electrically connected across both parasitic inductances $L_{e-low}$ and $L_{-Vbus}$ via the resistor $R_2$ and $R_3$. The resistor $R_2$ is placed in parallel with the series combination of the turn-on diode $D_3$ and of the resistor $R_{D3}$. If the resistor $R_{D3}$ is replaced by a short circuit, there is no compensation at turn-on and the IGBT leg 95 becomes equivalent to the IGBT leg 90, at least for the bottom compensation circuit. In the presence of the turn-on diode $D_3$, selection of a proper value for the resistor $R_{D3}$ allows to fine tune the turn-on of the bottom IGBT $Q_1$ independently from its turn-off, the bottom compensation circuit forming a resistive divider between $R_{D3}$ in parallel with $R_2$, this parallel combination being in series with $R_3$.

A ground reference 54 (GND high) is electrically connected to the emitter of the top IGBT $Q_2$, via the turn-on diode $D_4$ placed in series with a resistor $R_{D4}$. Turn-on diode $D_4$ is polarized to become short when an emitter voltage of the top IGBT $Q_2$ is higher than a voltage of the ground reference 54. The ground reference 54 is also electrically connected to collector 22 of the bottom IGBT $Q_1$ via the resistor $R_6$. The resistor $R_5$ is placed in parallel with the series combination of the turn-on diode $D_4$ and of the resistor $R_{D4}$. In the presence of the turn-on diode $D_4$, selection of a proper value for the resistor $R_{D4}$ allows to fine tune the turn-on of the top IGBT $Q_2$ independently from its turn-off, the top compensation circuit forming a resistive divider between $R_{D4}$ in parallel with $R_5$, this parallel combination being in series with $R_6$.

Considering the IGBT leg 90 of FIG. 4 and the IGBT leg 95 of FIG. 6, the top and bottom compensation circuits operate in similar ways. However, in a typical implementation, the emitter inductance $L_{e-high}$ of the top IGBT $Q_2$ is smaller than the emitter inductance $L_{e-low}$ of the bottom IGBT $Q_1$. Though the collector inductance $L_{c-low}$ of the bottom IGBT $Q_1$ can be combined with the emitter inductance $L_{e-high}$ of the top IGBT $Q_2$, FIGS. 4 and 6 showing that the resistor $R_6$ is connected between the emitter inductance $L_{e-high}$ of the top IGBT $Q_2$ and the collector inductance $L_{c-low}$ of the bottom IGBT $Q_1$, this combination is still smaller than the combination of the negative voltage tab inductance $L_{-Vbus}$ with the emitter inductance $L_{e-low}$. For that reason, though the top and bottom commutation cells of the IGBT legs 90 and 95 are constructed in the same manner, their behavior is somewhat different. While the above-described techniques work very well for the bottom IGBT $Q_1$, the emitter inductance $L_{e-high}$ is often too small to suitably clamp a voltage thereacross without increasing the gate resistor $R_4$ to protect the device. In fact, in practice, the emitter inductance $L_{e-high}$ of the top IGBT $Q_2$ in series with the collector inductance $L_{c-low}$ of the bottom IGBT $Q_1$, is oftentimes too low to be used to limit the overvoltage across the top IGBT $Q_2$ at the desired level.

Therefore, there is a need for improvements in circuits capable of reducing overvoltage occurring upon switching in a power converter.

SUMMARY

According to the present disclosure, there is provided a power converter configured for limiting switching overvoltage. The power converter comprises a bottom commutation cell that includes a bottom power electronic switch having a bottom gate, a bottom gate driver and a bottom compensation circuit connected to a bottom parasitic inductance. The bottom compensation circuit applies a sample of a voltage induced across the bottom parasitic inductance to the bottom gate driver at turn-off of the bottom power electronic switch. The power converter also comprises a top commutation cell that includes top power electronic switch having a top gate, a top gate driver and a top compensation circuit connected to the bottom parasitic inductance. The top compensation circuit applies a sample of a voltage induced across the bottom parasitic inductance to the top gate driver at turn-off of the top power electronic switch. The top and bottom commutation cells are part of a loop, being connected at a junction of a collector of the bottom power electronic switch and of an emitter of the top power electronic switch.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which:

FIG. 6 is a circuit diagram in which the compensation circuits of FIG. 4 are modified to impact the turn-on of the IGBTs; and FIG. 7 is a circuit diagram of an IGBT leg having turn-off diodes mounted in tandem according to an embodiment.

Like numerals represent like features on the various drawings.

DETAILED DESCRIPTION

Figure 1:
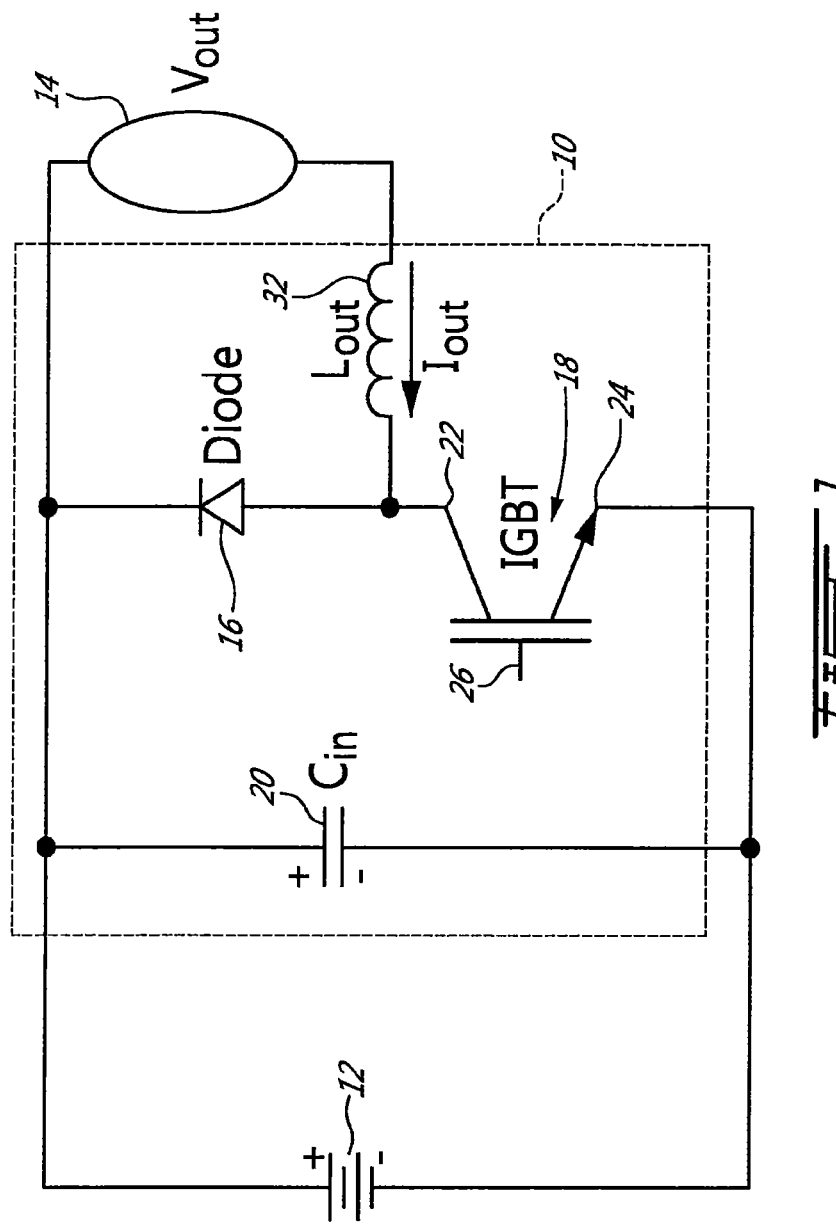
FIG. 1 is an idealized circuit diagram of a conventional commutation cell such as those used in conventional power converter circuits.
Figure 2:
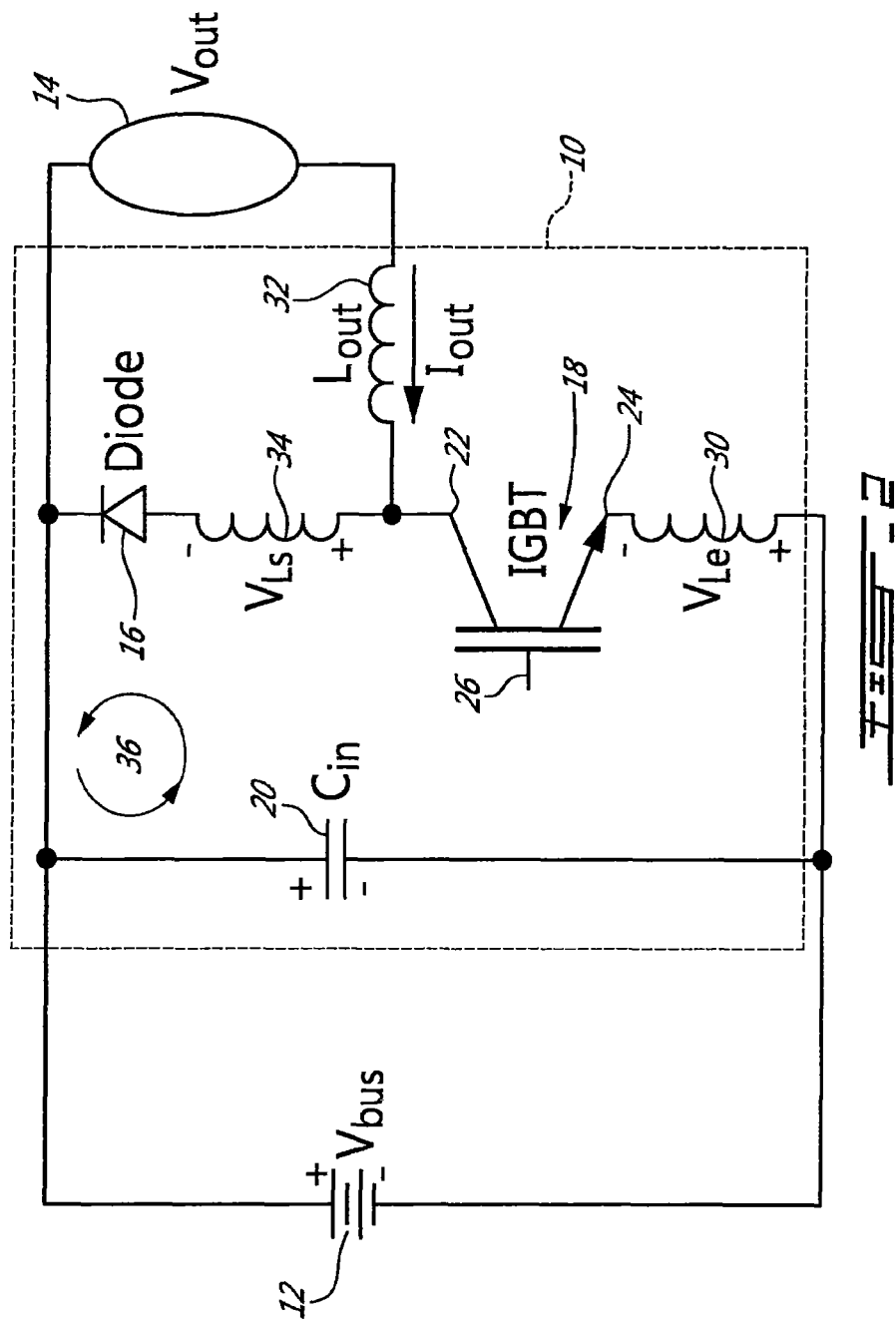
FIG. 2 is another circuit diagram of the conventional commutation cell of FIG. 1, showing parasitic (stray) inductances.
Figure 3:
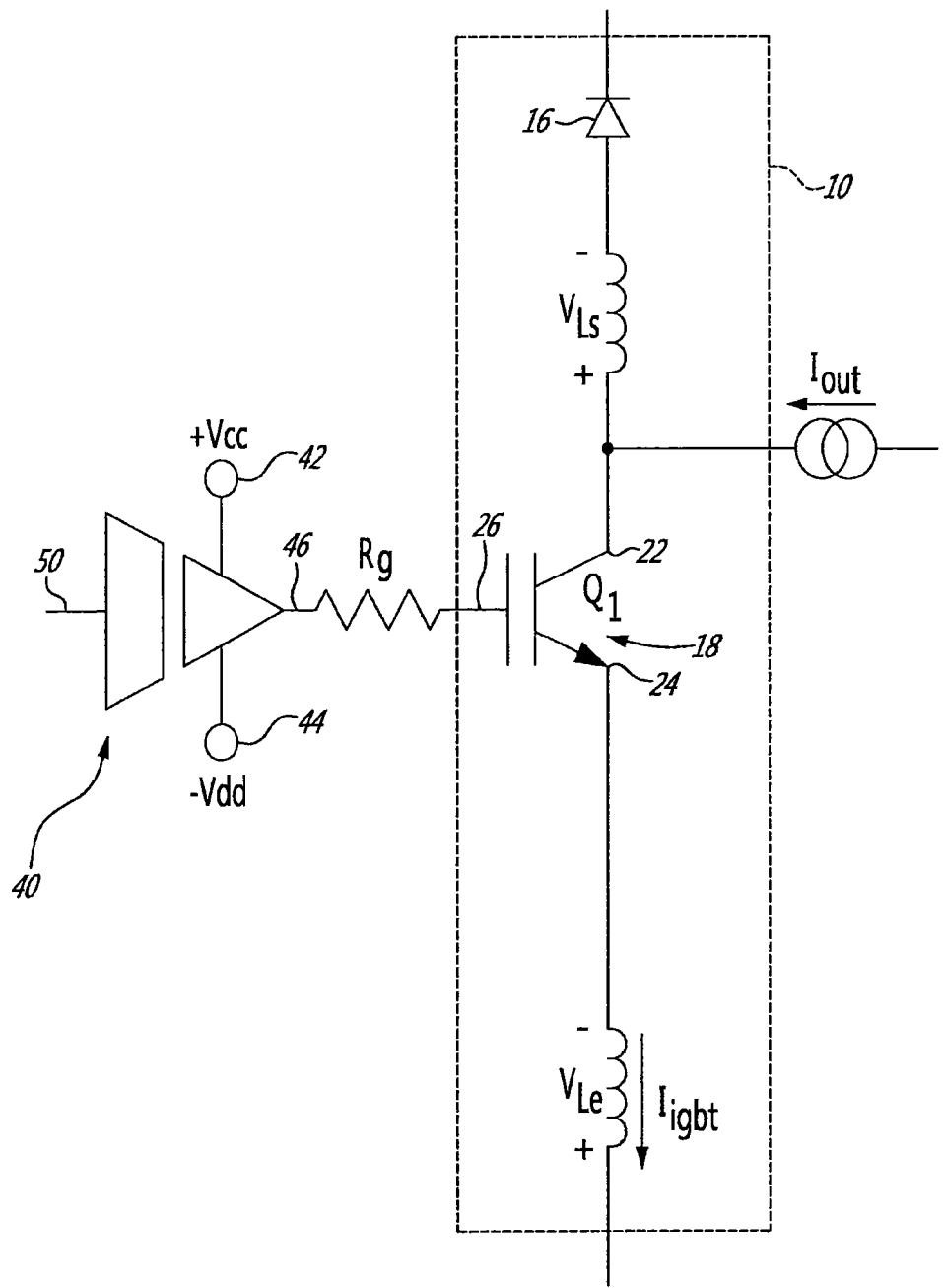
FIG. 3 is a circuit diagram of a conventional commutation cell further showing a gate driver.

Various aspects of the present disclosure generally address one or more of the problems related to overvoltage occurring upon switching in a power converter.

Circuits operable to limit overvoltage in commutation cells, especially at turn-off of IGBTs, are described in international patent publications no WO 2013/082705 A1, WO 2014/043795 A1, WO 2014/161080 A1, WO 2015/061901 A1, WO 2015/070347 A1 and WO 2015/139132 A1 and in U.S. provisional application No. 62/183,437, all of which are authored by Jean-Marc Cyr et al. the disclosure of these being incorporated by reference herein. The present technology provides control of overvoltage and switching losses at turn-off of a power electronic switch of a commutation cell. Circuits and methods presented herein are generally compatible with at least some aspects these other solutions to limit overvoltage at turn-off of power electronic switches.

In a commutation cell, di/dt at turn-off of a power electronic switch induces a voltage across parasitic (stray) inductances of a high frequency loop of the commutation cell. This voltage is present across the power electronic switch in addition to a bus voltage providing power to the commutation cell. A sum of these voltages can exceed the maximum voltage rating of the power electronic switch. Solution described hereinabove are based on the application of a sample of the overvoltage present across parasitic inductances of the commutation cell to a gate driver of the power electronic switch. When a pair of power electronic switches is connected in series to form a leg, because of circuit configurations that are generally used in such legs, a parasitic inductance present in a "top" commutation cell may not be sufficient to provide a sufficient voltage sample to control the overvoltage present across the top power electronic switch. An improvement described in details hereinbelow comprises a compensation circuit that is configured to sample a voltage induced across a parasitic inductance of one commutation cell to control the overvoltage upon turn-off of the other commutation cell. According to this solution, voltage samples are taken in the commutation cell having the largest parasitic inductance and are applied at turn-off of both commutation cells.

The techniques disclosed herein will mainly be described in relation to the use of isolated gate bipolar transistors (IGBT). Mentions of IGBTs in the following description are made for illustration purposes and are not meant to limit the present disclosure. The same techniques may equally be applied to commutation cells constructed using metal-oxide-semiconductor field-effect transistors (MOSFET), bipolar transistors and like power electronic switches.

The following terminology is used throughout the present disclosure:
 Commutation cell: an assembly of electronic components connected to a voltage source that alternatively applies voltage from a voltage source and zero voltage to a current source connected to a load.
 Power converter: circuit configured to convert energy from a first type of energy source, providing a different type of energy.
 Leg: a combination of a pair of commutation cells forming a power converter.
 Overvoltage: voltage across an electronic element that exceeds the voltage from the power source.
 Power electronic switch: an active on and off switchable element of a commutation cell.
 Bottom, top: in the context of the present disclosure, the terms "top" and "bottom" do not relate to physical characteristics of any element of the power converter, but rather to their placement on circuits diagrams shown in the various drawings.
 Compensation circuit: a circuit configured to provide a measure of the overvoltage on a power electronic switch as feedback to control and/or reduce the overvoltage.
 Parasitic inductance: an inductance that is usually not formed of a discrete component, but rather formed by the connection of two or more components such as the connection between a power electronic switch and a circuit board; also called stray inductance.
 Voltage sample: a voltage obtained from a circuit component, for example from a parasitic inductance, the obtained voltage being reduced by a voltage gain.

Resistive gain adapter: a combination of resistors providing a voltage gain.

Turn-on diode: a diode of a compensation circuit that is conductive during the turn-on of the power electronic switch in that compensation circuit.

Turn-off diode: a diode of a compensation circuit that is conductive during turn-off of the power electronic switch in that compensation circuit.

Freewheel diode: a diode in an anti-parallel position having regard to a power electronic switch.

Gate driver: a small buffer amplifier providing isolation and control signals for turning on and off a power electronic switch.

Reference: a floating ground reference of a gate driver on which a voltage sample can be applied.

Figure 4:
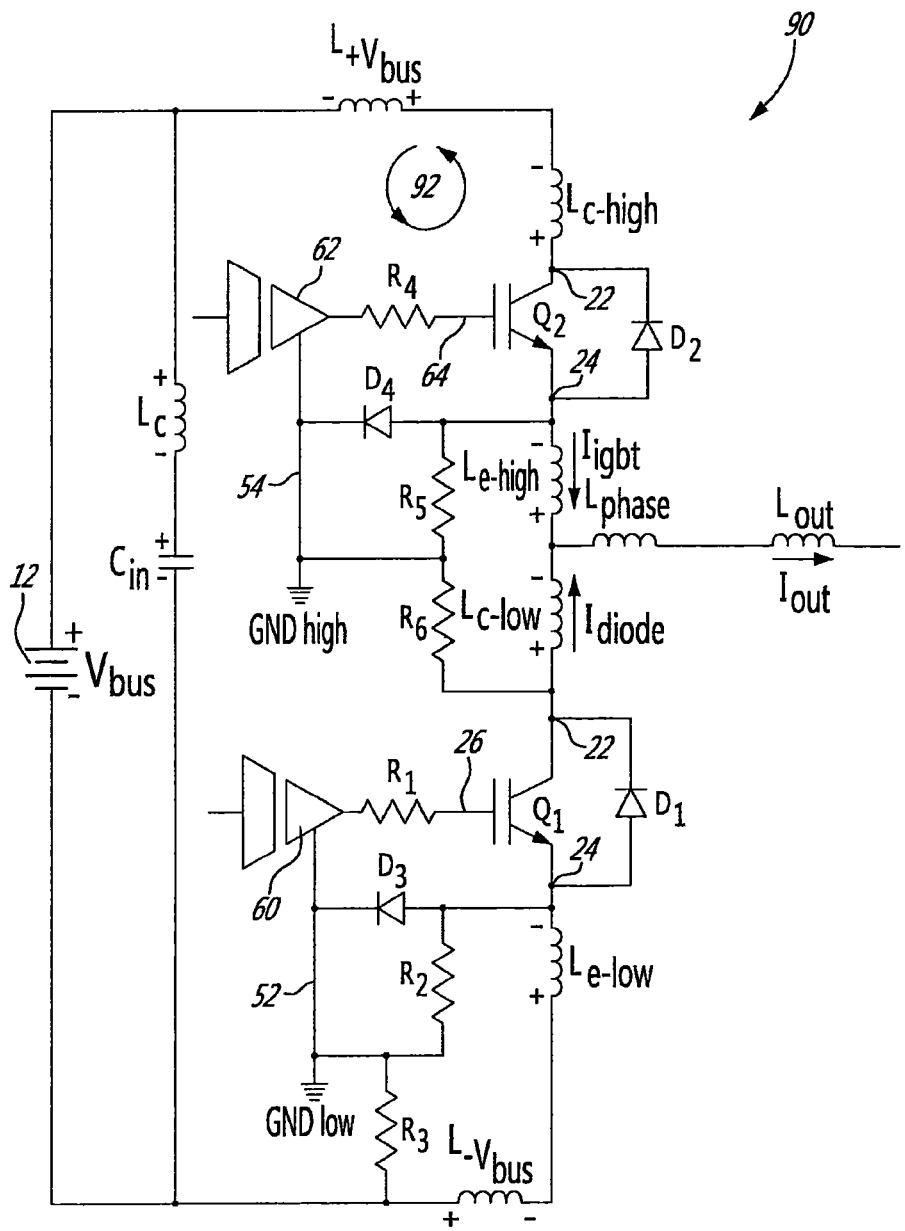
FIG. 4 is a circuit diagram of an IGBT leg having resistive dividers connected across parasitic (stray) emitter inductances, forming compensation circuits.
Figure 5:
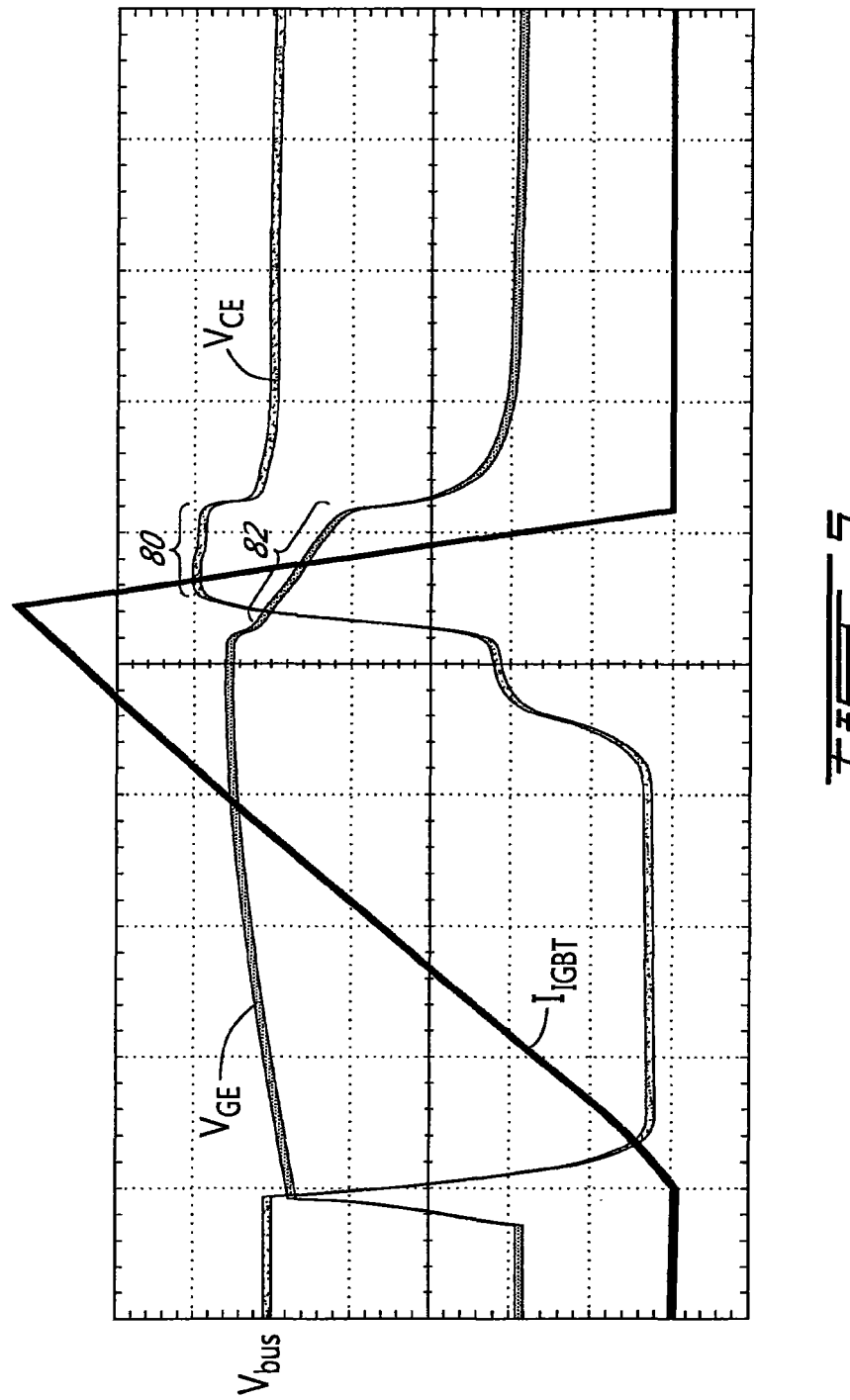
FIG. 5 is a diagram showing turn-off waveforms of the bottom IGBT of FIG. 4.

Referring now to the drawings, FIG. 7 is a circuit diagram of an IGBT leg having turn-off diodes mounted in tandem according to an illustrative embodiment. Several elements of an IGBT leg 100 were introduced in the foregoing description of FIGS. 4 and 5 and are not described in details hereinbelow. Generally stated, the same power electronic switches (IGBTs $Q_1$ and $Q_2$) and freewheel diodes ($D_1$ and $D_2$) are placed on the same or similar circuit card, creating the same or equivalent parasitic inductances. The bottom commutation cell, including the bottom IGBT $Q_1$, the bottom gate driver 60 with its reference 52, and the bottom compensation circuit having the resistors $R_2$, $R_3$ and $R_{D3}$, as well as the turn-on diode $D_3$, is reproduced without significant changes. The bottom commutation cell of the IGBT leg 100 operates in the same manner as the bottom commutation cell of the IGBT leg 90 if the $R_{D3}$ has zero resistance (being a short-circuit), or in the same manner as the bottom commutation cell of the IGBT leg 95 if a value of $R_{D3}$ is greater than zero.

The IGBT leg 100 mainly differs from the above-described circuits by its top compensation circuit that allows the top gate driver 62 to control the top IGBT $Q_2$ based on a sample of a voltage induced across the large bottom parasitic inductance $L_{e-low}$ and across the parasitic inductance $L_{-Vbus}$.

The IGBT leg 100 forms a power converter configured for limiting switching overvoltage. Top and bottom commutation cells form a loop, being connected at a junction of a collector 22 of a bottom power electronic switch, illustrated as the bottom IGBT $Q_1$, and of an emitter 24 of a top power electronic switch, illustrated as the top IGBT $Q_2$. The bottom commutation cell includes the bottom IGBT $Q_1$, and a bottom compensation circuit connected to a bottom parasitic inductance that includes the parasitic emitter inductance $L_{e-low}$ of the bottom IGBT $Q_1$ and the parasitic negative voltage tab inductance $L_{-Vbus}$. The bottom compensation circuit applies a sample of a voltage induced across the bottom parasitic inductance at turn-off of the bottom IGBT $Q_1$. The top commutation cell includes the top IGBT $Q_2$, and a top compensation circuit that is also connected to the bottom parasitic inductance. The top compensation circuit applies a sample of a voltage induced across the bottom parasitic emitter upon turn-off of the top IGBT $Q_2$, when the opposite freewheel diode $D_1$ is conducting.

Applying the sample of the voltage induced across the bottom parasitic inductance to the bottom gate driver 60 at turn-off of the bottom IGBT $Q_1$ controls the voltage induced across the bottom parasitic inductance. This in turn limits the overvoltage on the bottom IGBT $Q_1$. Likewise, applying the sample of the voltage induced across the bottom parasitic inductance to the top gate driver 62 at turn-off of the top IGBT $Q_2$ controls voltages induced throughout the parasitic inductance included in the loop of the IGBT leg 100. This in turn limits the overvoltage on the top IGBT $Q_2$.

Without limiting the present disclosure, the sample of the voltage induced across the bottom parasitic inductance upon turn-off of the bottom IGBT $Q_1$ is applied by the bottom compensation circuit to a reference 52 of a bottom gate driver 60 connected to a gate 26 of the bottom IGBT $Q_1$. Also without limitation, the sample of the voltage induced across the bottom parasitic inductance upon turn-off of the top IGBT $Q_2$ is applied by the top compensation circuit to a reference 54 of a top gate driver 62 connected to a gate 64 of the top IGBT $Q_2$.

The bottom compensation circuit comprises a bottom resistive gain adapter that includes resistors $R_2$, $R_3$ and $R_{D3}$, as well as a turn-on diode D3 that places a resistor $R_{D3}$ in parallel with $R_2$ when turning-on the bottom IGBT $Q_1$. Values of the resistors $R_2$, $R_3$ and $R_{D3}$ may be similar to those of the circuits of FIGS. 4 and 6, or may be selected according to the needs of a particular application. The bottom compensation circuit applies the sample of the voltage induced across the bottom parasitic inductance of the high frequency loop 92 at turn-off of the bottom IGBT $Q_1$, for example on the reference 52 of the bottom gate driver 60, using a voltage gain $G_1$ defined according to equation (1):

$$G_1 = \frac{R_2}{(R_2 + R_3)} \quad (1)$$

The bottom compensation circuit applies a sample of another voltage induced across the bottom parasitic inductance at turn-on of the bottom IGBT $Q_1$, for example on the reference 52 of the bottom gate driver 60, using a voltage gain $G_2$ defined according to equation (2):

$$G_2 = \frac{\left(\frac{R_2 \cdot R_{D3}}{R_2 + R_{D3}}\right)}{\left(\left(\frac{R_2 \cdot R_{D3}}{R_2 + R_{D3}}\right) + R_3\right)} \quad (2)$$

It will be noted that given that the parallel combination of $R_2$ with $R_{D3}$ is smaller than $R_2$ when $R_{D3}$ is not infinite, the voltage gain applied at turn-on of the bottom IGBT $Q_1$ is smaller than the voltage gain applied at its turn-off.

As shown on FIG. 7, the resistor $R_3$ connects the reference 52 of the gate driver 60 downstream of the negative voltage tab. Connecting the resistor $R_3$ upstream of the negative voltage tab would exclude the parasitic negative voltage tab inductance $L_{Vbus}$. It is however generally desirable to connect the resistor $R_3$ downstream of the negative voltage tab in order to maximize the voltage to be sampled.

Turning now to the top commutation cell, its top compensation circuit includes a turn-off diode $D_5$ that connects the top compensation circuit to the bottom parasitic inductance upon di/dt at turn-off of the top IGBT $Q_2$. In a variant, the turn-off diode $D_5$ is selected such that a voltage drop across the turn-off diode $D_5$ is greater than a voltage drop across the bottom freewheel diode $D_1$ when $D_1$ is also conducting to ensure the load current will not circulate in the diode $D_5$, which is a low power diode. For example, the turn-off diode may include a pair of turn-off diodes $D_5$ connected in series to provide the desired voltage drop. Regardless of the specific configuration of the turn-off diode(s) $D_5$, upon turn-off of the top IGBT $Q_2$, a large overvoltage induced between its collector 22 and its emitter 24 causes its emitter voltage to be more negative than a voltage of the negative voltage tab $-V_{bus}$. $D_5$ therefore becomes conductive upon turn-off of the top IGBT $Q_2$. In contrast, upon turn-on of the top IGBT $Q_2$, its emitter voltage is higher than the voltage of the negative voltage tab $-V_{bus}$ and the turn-off diode $D_5$ is blocked.

It is to be noted that while the anode of diode $D_5$ is shown connected to the capacitor $C_{in}$, it could also be connected to GND low.

The top compensation circuit comprises two resistive gain adapters formed of resistors $R_5$, $R_6$ and $R_{D4}$, complemented with a turn-on diode $D_4$. Values of the resistors $R_5$, $R_6$ and $R_{D4}$ may differ from to those of the circuits of FIGS. 4 and 6.

Upon negative di/dt in the high frequency loop 92 at turn-off of the top IGBT $Q_2$, when the turn-off diode $D_5$ is conductive and when the turn-on diode $D_4$ is blocked, the top compensation circuit applies the sample of the voltage induced across the bottom parasitic inductance, for example on the reference 54 of the top gate driver 62, using a voltage gain $G_3$ defined according to equation (3):

$$G_3 = \frac{R_5}{(R_5 + R_6)} \tag{3}$$

Upon turn-on of the top IGBT $Q_2$, when the turn-off diode $D_5$ is blocked and the turn-on diode $D_4$ is conductive. In that condition the top compensation circuit applies a sample of a voltage induced across a top parasitic inductance that includes the parasitic emitter inductance of the top power electronic switch $L_{e\text{-}high}$, and optionally includes the parasitic collector inductance $L_{c\text{-}low}$ of the bottom IGBT $Q_1$. This sample is for example applied on the reference 54 of the top gate driver 62, using a voltage gain $G_4$ defined according to equation (4):

$$G_4 = \frac{R_{D4}}{(R_{D4} + R_5)} \tag{4}$$

If the value of $R_{D4}$ is zero (this resistor being replaced by a short circuit), the turn-on of top IGBT $Q_2$ is not impacted by the top compensation circuit.

As shown on FIG. 7, the turn-off diode $D_5$ and the resistor $R_6$ connect the reference 54 of the gate driver 62 downstream of the negative voltage tab. Likewise, the resistor $R_5$ connects the reference 54 of the gate driver 62 directly on the collector 22 of the bottom IGBT $Q_1$. Connecting the resistor $R_5$ to the phase tab of the IGBT leg 100 would exclude the parasitic collector inductance $L_{c\text{-}low}$ of the bottom IGBT $Q_1$. In line with above described reasoning, it is generally interesting to connect the resistor $R_5$ directly on the collector 22 of the bottom IGBT $Q_1$ in order to maximize the voltage to be sampled.

A three-phase alternative current (AC) power source operable to drive a motor (not shown) or a similar load can be built by combining three (3) IGBT legs such as the IGBT leg 100.

The foregoing describes solutions applicable to DC-DC power converters, AC-DC power converters and to DC-AC power converters, for example commutation cells using a full leg of semiconductors, opposite pairs of power electronic switches and freewheel diodes, to provide alternative current to a connected load such as a motor of an electric vehicle. The energy may flow through the IGBT leg 100 in both directions, from the voltage source to the current source or from the current source to the voltage source Those of ordinary skill in the art will realize that the description of the power converter configured for limiting switching overvoltage are illustrative only and are not intended to be in any way limiting. Other embodiments will readily suggest themselves to such persons with ordinary skill in the art having the benefit of the present disclosure. Furthermore, the power converter configured for limiting switching overvoltage may be customized to offer valuable solutions to existing needs and problems of overvoltage occurring upon switching in power converters.

In the interest of clarity, not all of the routine features of the implementations of the power converter configured for limiting switching overvoltage are shown and described. It will, of course, be appreciated that in the development of any such actual implementation of the power converter configured for limiting switching overvoltage, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the power converter configured for limiting switching overvoltage is not limited in its application to the details of construction and parts illustrated in the accompanying drawings and described hereinabove. The proposed power converter configured for limiting switching overvoltage is capable of other embodiments and of being practiced in various ways. It is also to be understood that the phraseology or terminology used herein is for the purpose of description and not limitation.

The present disclosure has been described in the foregoing specification by means of non-restrictive illustrative embodiments provided as examples. These illustrative embodiments may be modified at will. The scope of the claims should not be limited by the embodiments set forth in the examples, but should be given the broadest interpretation consistent with the description as a whole.

What is claimed is:

1. A power converter configured for limiting switching overvoltage, comprising:
    a bottom commutation cell including a bottom power electronic switch having a bottom gate, a bottom gate driver and a bottom compensation circuit connected to a bottom parasitic inductance to apply a sample of a voltage induced across the bottom parasitic inductance to the bottom gate driver at turn-off of the bottom power electronic switch; and
    a top commutation cell including a top power electronic switch having a top gate, a top gate driver and a top compensation circuit connected to the bottom parasitic inductance to apply a sample of a voltage induced across the bottom parasitic inductance to the top gate driver at turn-off of the top power electronic switch;
    wherein the top and bottom commutation cells are part of a loop, being connected at a junction of a collector of the bottom power electronic switch and of an emitter of the top power electronic switch;
    wherein the top compensation circuit comprises a turn-off diode configured to place a top resistive gain adapter having fourth resistor and in series with a fifth resistors when turning-off the top power electronics switch, the fourth and fifth resistor forming a top resistive gain adapter which defines a third voltage gain of the top compensation circuit, the third voltage gain being applied in sampling the voltage induced across the bottom parasitic inductance upon turn-off of the top power electronic switch, the top compensation circuit further comprising a top turn-on diode configured to place a sixth resistor in series with the fourth resistor when turning-on the top power electronic switch, the sixth and fourth resistors defining a fourth voltage gain of the top compensation circuit, the fourth voltage gain being applied in sampling the voltage induced across the top parasitic inductance at turn-on of the top power electronic switch.

2. The power converter of claim 1, wherein the bottom parasitic inductance includes a parasitic emitter inductance of the bottom power electronic switch.

3. The power converter of claim 1, wherein the bottom parasitic inductance includes a parasitic emitter inductance of the bottom power electronic switch and a parasitic negative voltage tab inductance.

4. The power converter of claim 1, wherein applying the sample of the voltage induced across the bottom parasitic inductance at turn-off of the bottom power electronic switch controls the voltage induced across the bottom parasitic inductance.

5. The power converter of claim 1, wherein the bottom gate driver has a bottom reference to receive the sample of the voltage induced across the bottom parasitic inductance from the bottom compensation circuit and the top gate driver has a top reference to receive the sample of the voltage induced across the bottom parasitic inductance from the top compensation circuit.

6. The power converter of claim 1, wherein:
the bottom compensation circuit is configured to apply the sample of the voltage induced across the bottom parasitic inductance to the bottom gate driver at turn-off of the bottom power electronic switch using a first voltage gain; and
the bottom compensation circuit is configured to apply another sample of the voltage induced across the bottom parasitic inductance to the bottom gate driver at turn-on of the bottom power electronic switch using a second voltage gain lower than the first voltage gain and greater than or equal to zero.

7. The power converter of claim 6, wherein the bottom compensation circuit comprises a bottom resistive gain adapter having first and second resistors defining the first voltage gain and a bottom turn-on diode configured to place a third resistor in parallel with the first resistor when turning-on the bottom power electronic switch, the first, second and third resistors defining the second voltage gain.

8. The power converter of claim 1, comprising a bottom freewheel diode in parallel with the bottom power electronic switch, wherein the turn-off diode is selected such that a voltage drop across the turn-off diode is greater than a voltage drop across the bottom freewheel diode.

9. The power converter of claim 8, wherein the turn-off diode comprises two turn-off diodes connected in series.

10. The power converter of claim 1, wherein the top compensation circuit is configured to apply a sample of a voltage induced across a top parasitic inductance at turn-on of the top power electronic switch.

11. The power converter of claim 10, wherein the top parasitic inductance is a parasitic emitter inductance of the top power electronic switch.

12. The power converter of claim 10, wherein the top parasitic inductance includes a parasitic emitter inductance of the top power electronic switch and a parasitic collector inductance of the bottom power electronic switch.

13. The power converter of claim 1, comprising an input capacitance, wherein the input capacitance closes the loop formed with the top and bottom commutation cells.

* * * * *